United States Patent
Chen et al.

(10) Patent No.: US 11,410,999 B2
(45) Date of Patent: Aug. 9, 2022

(54) BOUNDARY DESIGN FOR HIGH-VOLTAGE INTEGRATION ON HKMG TECHNOLOGY

(71) Applicant: Taiwan Semiconductor Manufacturing Co., Ltd., Hsin-Chu (TW)

(72) Inventors: Yi-Huan Chen, Hsin Chu (TW); Chien-Chih Chou, New Taipei (TW); Alexander Kalnitsky, San Francisco, CA (US); Kong-Beng Thei, Pao-Shan Village (TW); Ming Chyi Liu, Hsinchu (TW); Shih-Chung Hsiao, Hsin-Chu (TW); Jhih-Bin Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

(21) Appl. No.: 16/797,334

(22) Filed: Feb. 21, 2020

(65) Prior Publication Data
US 2021/0265344 A1   Aug. 26, 2021

(51) Int. Cl.
| | |
|---|---|
| *H01L 27/092* | (2006.01) |
| *H01L 21/28* | (2006.01) |
| *H01L 21/8238* | (2006.01) |
| *H01L 29/06* | (2006.01) |
| *H01L 29/51* | (2006.01) |
| *H01P 1/15* | (2006.01) |
| *H01L 23/48* | (2006.01) |

(52) U.S. Cl.
CPC .... *H01L 27/0922* (2013.01); *H01L 21/28008* (2013.01); *H01L 21/823821* (2013.01); *H01L 21/823842* (2013.01); *H01L 21/823857* (2013.01); *H01L 27/0924* (2013.01); *H01L 29/0649* (2013.01); *H01L 29/517* (2013.01); *H01L 23/481* (2013.01); *H01P 1/15* (2013.01)

(58) Field of Classification Search
CPC ............ H01L 27/0922; H01L 27/0924; H01L 21/28008; H01L 21/823821; H01L 21/823842; H01L 21/823857; H01L 29/517
See application file for complete search history.

(56) References Cited

U.S. PATENT DOCUMENTS

| | | | |
|---|---|---|---|
| 2018/0151579 A1* | 5/2018 | Liu | H01L 27/11526 |
| 2019/0067282 A1* | 2/2019 | Chen | H01L 27/0922 |

\* cited by examiner

*Primary Examiner* — Christine A Enad
(74) *Attorney, Agent, or Firm* — Eschweiler & Potashnik, LLC

(57) ABSTRACT

The present disclosure relates to an integrated circuit (IC) that includes a boundary region defined between a low voltage region and a high voltage region, and a method of formation. In some embodiments, the integrated circuit comprises an isolation structure disposed in the boundary region of the substrate. A first polysilicon component is disposed over the substrate alongside the isolation structure. A boundary dielectric layer is disposed on the isolation structure. A second polysilicon component is disposed on the sacrifice dielectric layer.

20 Claims, 15 Drawing Sheets

BOUNDARY DESIGN FOR HIGH-VOLTAGE INTEGRATION ON HKMG TECHNOLOGY

BACKGROUND

The semiconductor integrated circuit (IC) industry has experienced exponential growth over the last few decades. In the course of IC evolution, high voltage technology has been widely used in power management, regulator, battery protector, DC motor, automotive relative, panel display driver (STN, TFT, OLED, etc.), color display driver, power supply relative, telecom, etc. On the other hand, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the typically polysilicon gate electrode of a logic core with a metal gate electrode and a high-k dielectric, also known as HKMG replacement gate device, to improve device performance with the decreased feature sizes. High voltage devices are integrated on the same chip with the HKMG logic core, and support the logic core to accomplish an intended function and limits or eliminate inter-chip communication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
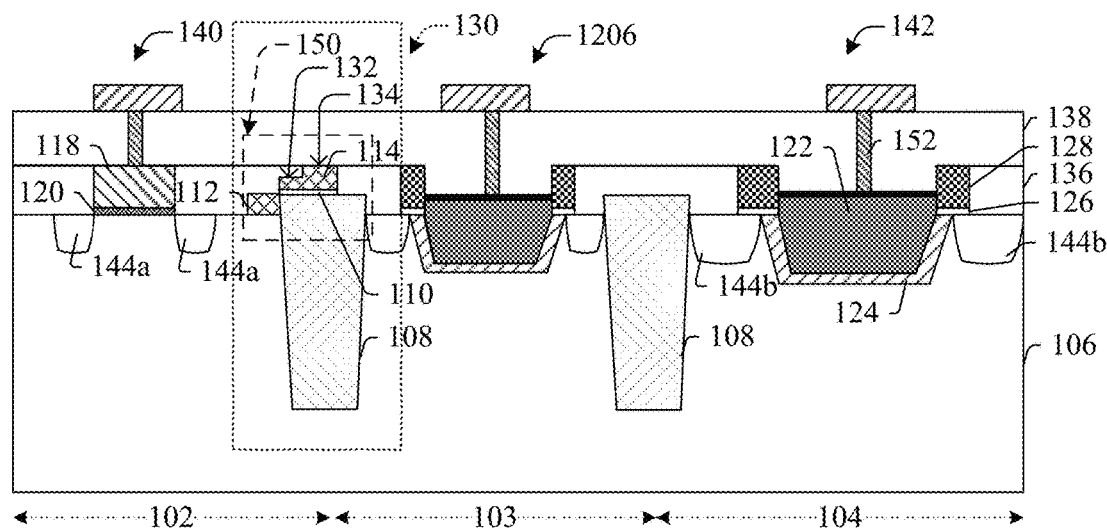
FIG. 1 illustrates a cross-sectional view of some embodiments of an integrated circuit (IC) comprising a boundary region defined between a low voltage region and a high voltage region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-k metal gate (HKMG) technology has become one of the front-runners for the next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power. HKMG technology can be used for memory devices, display devices, sensor devices, among other applications where a high voltage region is needed and incorporated in the integrated circuits to provide higher power and have higher breakdown voltage than conventional MOS devices. However, there are challenges to embed HKMG devices and high voltage devices especially on 28 nm node and beyond process. A problem associated with such integrated circuits, is boundary defects between a high voltage region where the high voltage devices reside and a low voltage device region where devices operate in relative lower voltages. For example, the gate dielectrics for the high voltage region and the low voltage region often require different thickness and thus may need to be processed separately. Comparatively high isolation damage and toxic material residues can be introduced due to gate dielectrics' patterning and removal. For example, high-k dielectric residues may be left in the boundary region, which could result in contamination for subsequent processes. In addition, the boundary region between the high voltage region and the low voltage region may lack structure supports, and a dishing effect introduced by planarization processes may result in uneven surfaces and affect device performance in low voltage region and/or high voltage region.

The present disclosure relates to an integrated circuit (IC) that comprises a boundary structure disposed in a boundary region between a low voltage region and a high voltage region, and a method of formation therefor. In some embodiments, referring to FIG. 1 for example, an integrated circuit 100 comprises a substrate 106 including a low voltage region 102, a medium voltage region 103, a high voltage region 104, and a boundary region 130 defined between the low voltage region 102 and the medium voltage region 103. A boundary structure 150 is disposed in the boundary region 130. The boundary structure 150 may comprise an isolation structure 108, a first polysilicon component 112 disposed over the substrate 106 adjacent to the isolation structure 108, a boundary dielectric layer 110 disposed on the isolation structure 108, and a second polysilicon component 114 disposed over the boundary dielectric layer 110. By arranging the boundary structure 150 in the boundary region, the isolation damage and uneven surface are reduced, and thus device performance is improved. In some further embodiments, a method of forming the boundary structure 150 comprises forming a supporting layer covering the high voltage region before forming and patterning low voltage device precursor layers (which may include high-k dielectric material). The supporting layer is formed to have a slanted sidewall surface in the boundary region such that residues from the patterning of the low voltage device precursor layers are minimized in the boundary region. Therefore, the contaminations are reduced.

Figure 2:
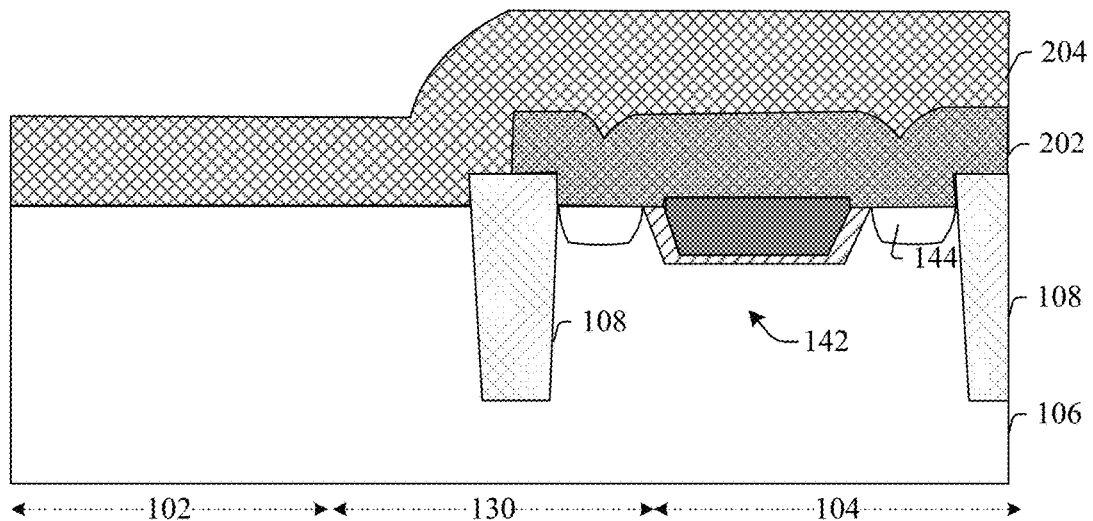
FIGS. 2-8 illustrate a series of cross-sectional views of some embodiments of a method for manufacturing an IC comprising a boundary region defined between a low voltage region and a high voltage region.

Referring to FIGS. 2-8 for example, in some embodiments, a first supporting layer 202 is formed over a high voltage transistor device 142 in the high voltage region 104 followed by forming a second supporting layer 204 as shown in FIG. 2. The second supporting layer 204 is formed over the first supporting layer 202 in the high voltage region 104 such that there is a height different from a lower portion in the low voltage region 102.

Figure 3:
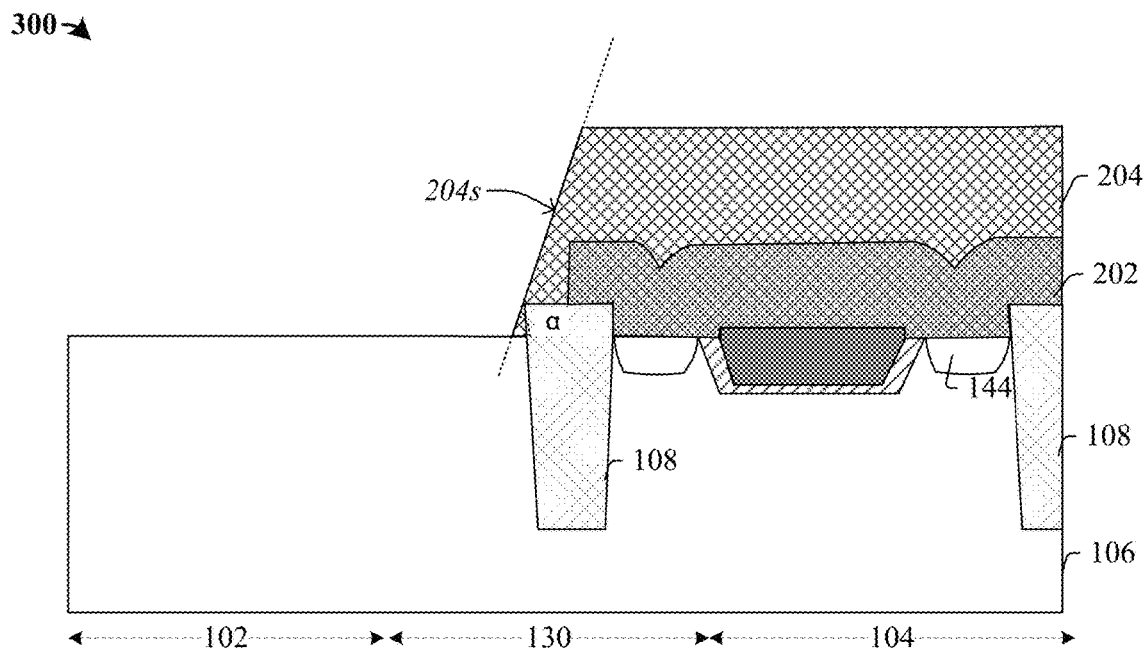
Figure 15:
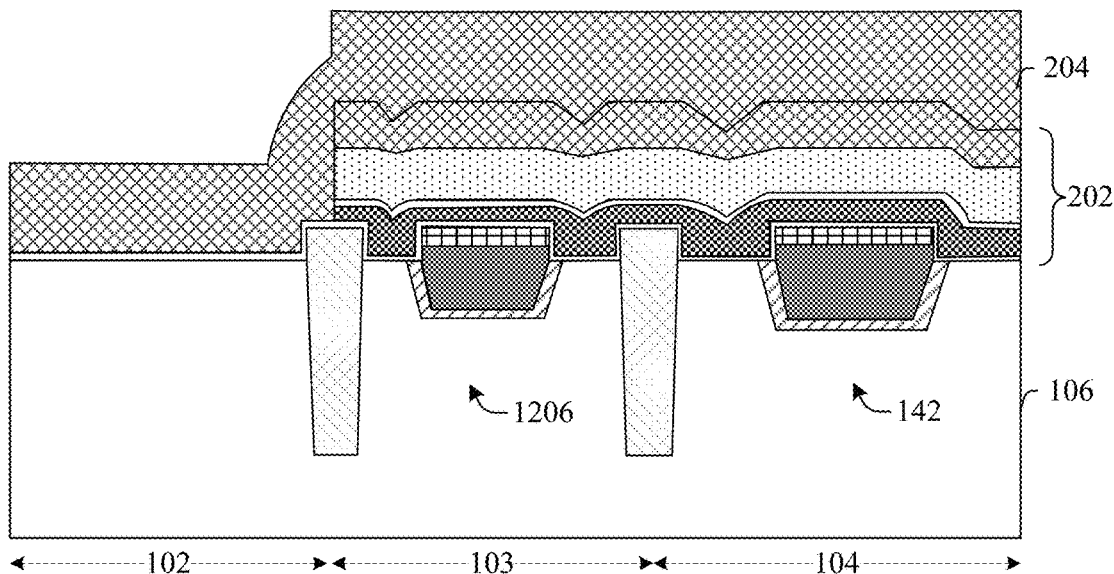
Figure 16:
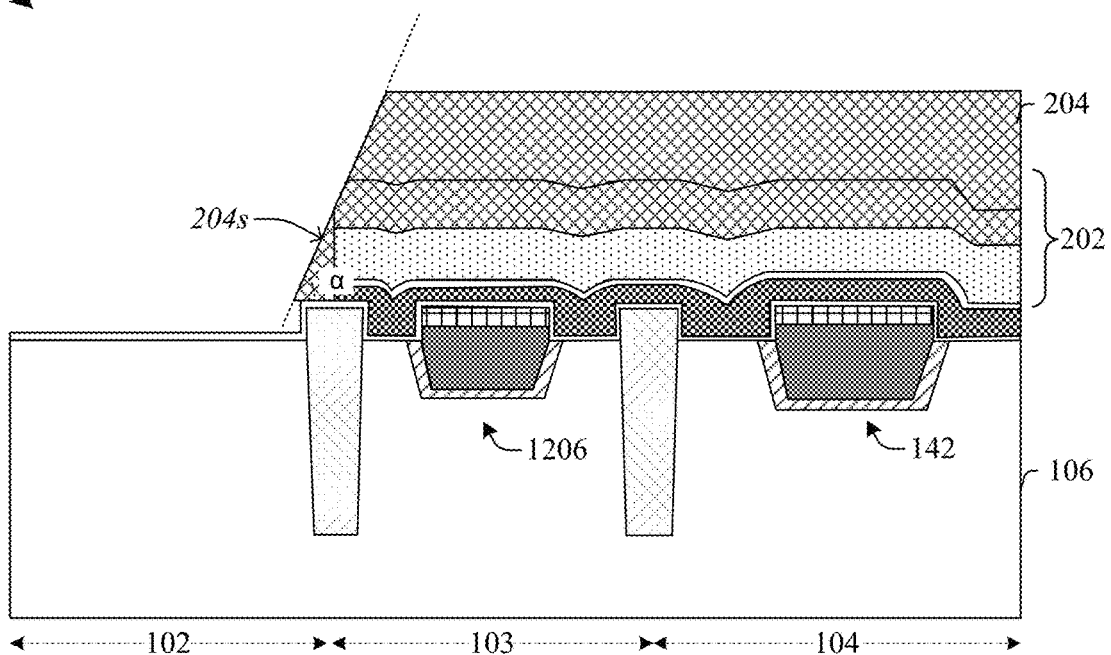

As shown in FIG. 3, in some embodiments, an etching process is then performed to the second supporting layer 204 to form a slanted sidewall 204s. In some alternative embodiments, the etching process also removes a portion of the first supporting layer 202 such that the slanted sidewall 204s is collectively formed by the first supporting layer 202 and the second supporting layer 204 (e.g. as shown in FIGS. 15-16). The first supporting layer 202 and the second supporting layer 204 may be collectively referred as a supporting layer. The slanted sidewall 204s is tilted to the high voltage region from bottom to top and may have a tilted angle α substantially equal to 45 degrees or in a range of about 30 degrees to about 45 degrees.

Figure 4:
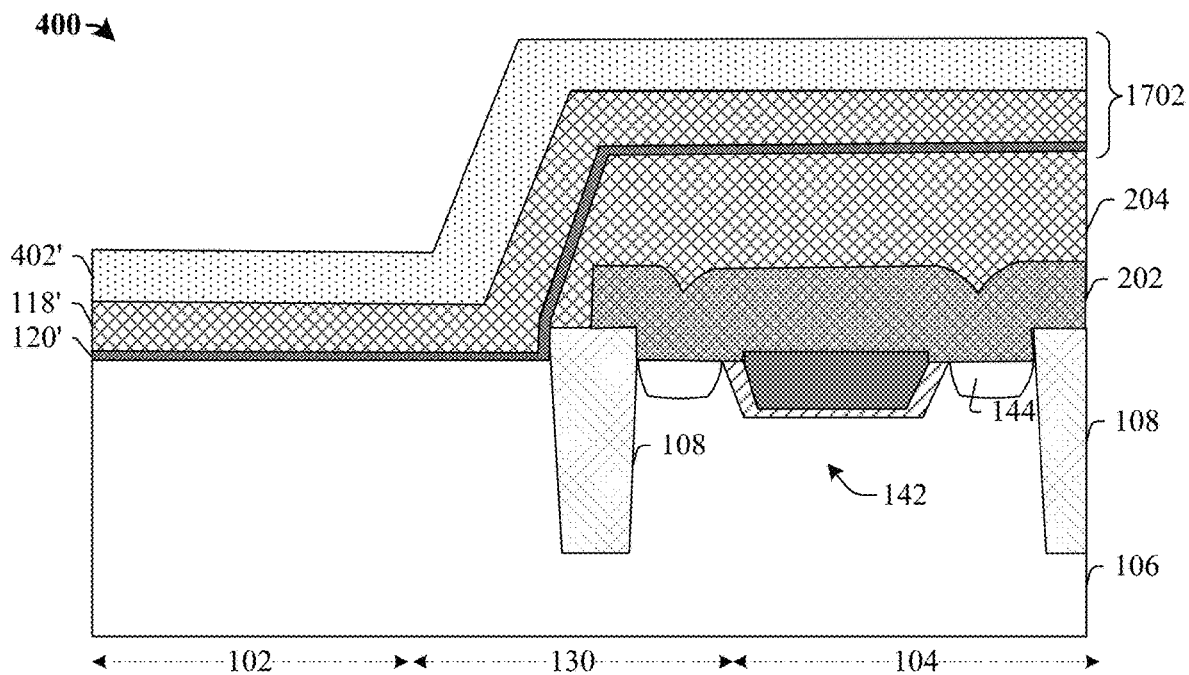

As shown in FIG. 4, in some embodiments, a stack of low voltage gate precursor layers 1702 is formed over the substrate 106 in the low voltage region 102 and on the second supporting layer 204 in the high voltage region 104. The low voltage gate precursor layers 1702 may comprise a low voltage gate electrode layer 118', a low voltage gate dielectric layer 120', and a masking layer 402'.

Figure 5:
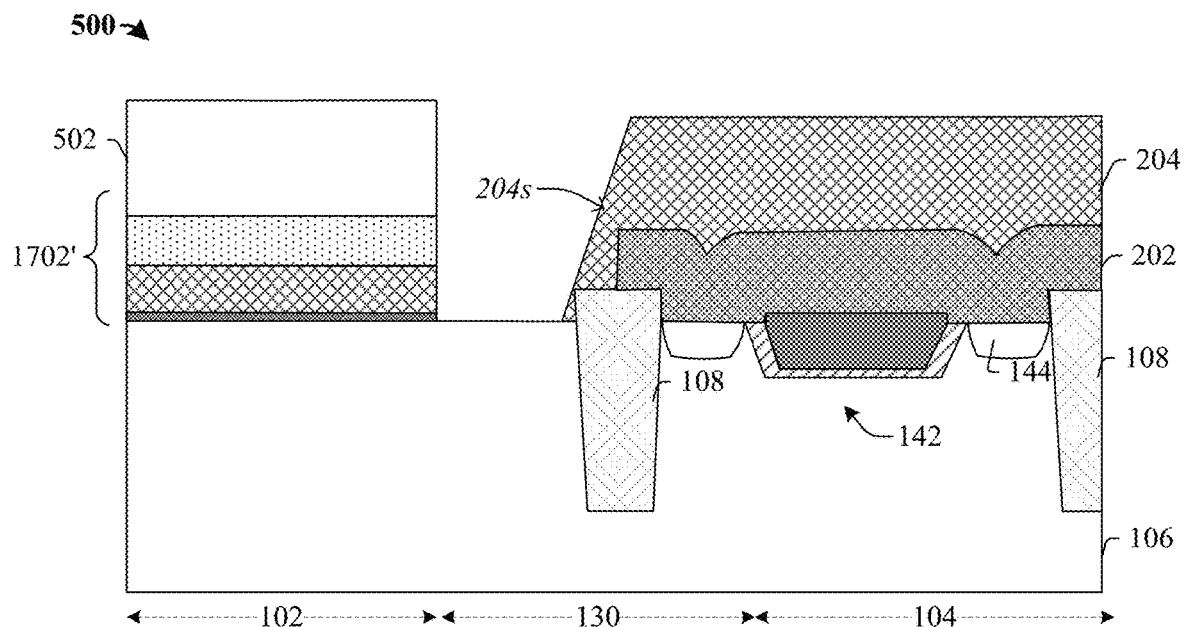

As shown in FIG. 5, in some embodiments, the low voltage gate precursor layer 1702 is patterned to be removed from the high voltage region 104 and leave an altered low voltage gate precursor layer 1702' in the low voltage region 102. The patterning process may comprise a photolithography process where the altered low voltage gate precursor layer 1702' may be covered by a masking layer 502 from removal. The masking layer 502 may be made of photoresist mask or transferred hard mask made of dielectric or other applicable materials. The low voltage gate precursor layer 1702 is removed from the boundary region 130 completely due to the continuous and slanted sidewall 204s.

Figure 6:
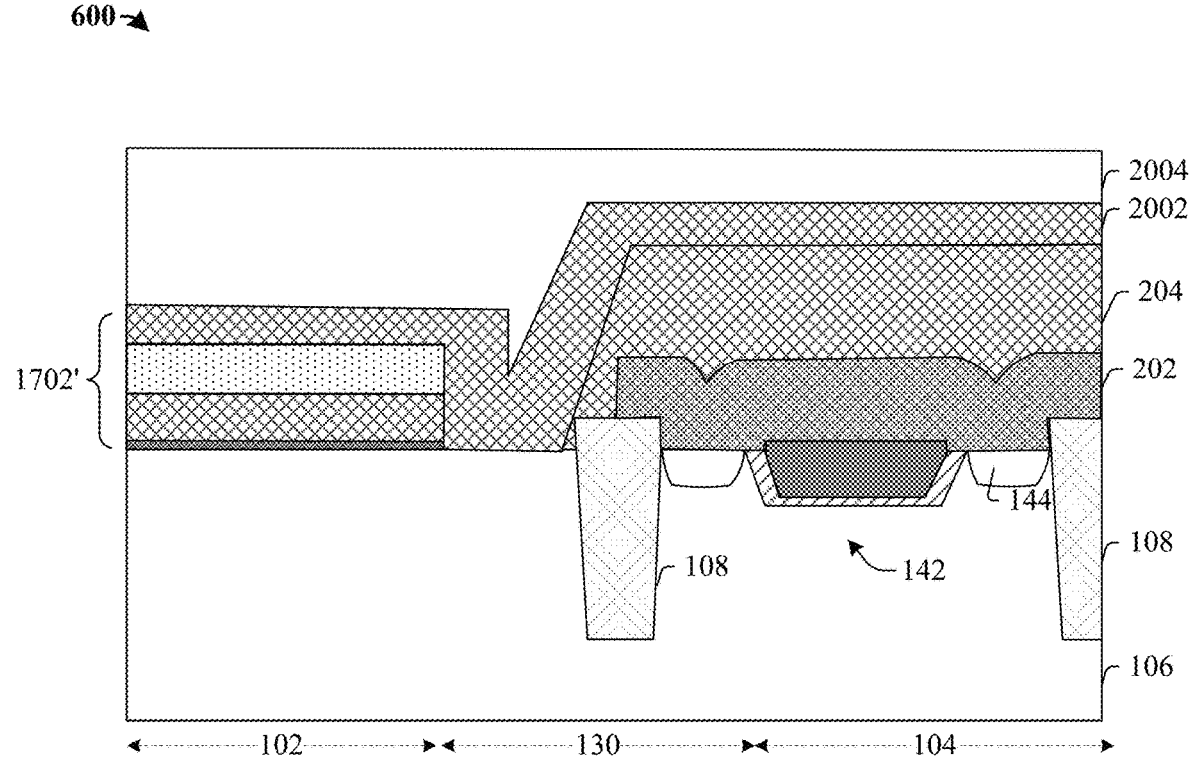

As shown in FIG. 6, in some embodiments, a boundary filling process is performed to fill a slit between the low voltage region 102 and the high voltage region 104. In some embodiments, a conformal layer and a filling layer are formed to fill the slit. For example, a conformal polysilicon layer 2002 is deposited on the altered low voltage gate precursor layer 1702' and the second supporting layer 204. A filling layer 2004 (e.g. made of photoresist material) may be subsequently coated or spin-on to form a planar top surface.

Figure 7:
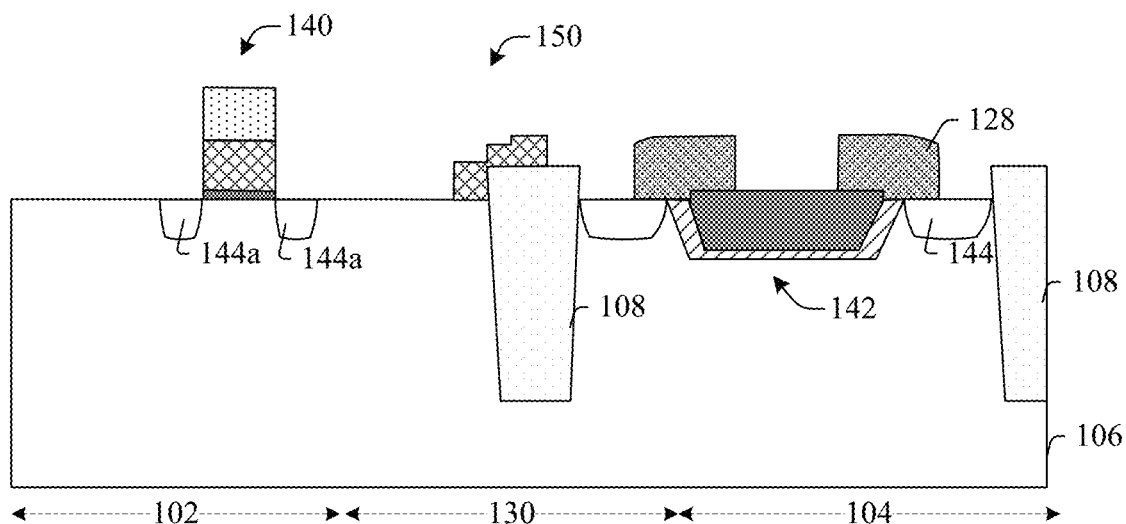

As shown in FIG. 7, in some embodiments, a patterning process is performed to form a low voltage transistor device 140 in the low voltage region 102, a boundary structure 150 in the boundary region 130, and a gate masking structure layer 128 in the high voltage region 104 respectively from the altered low voltage gate precursor layer 1702', the conformal polysilicon layer 2002, the first supporting layer 202, and/or the second supporting layer 204. A pair of source/drain regions 144a may be formed in the substrate 106 on opposite sides of the low voltage gate stack 1702".

Figure 8:
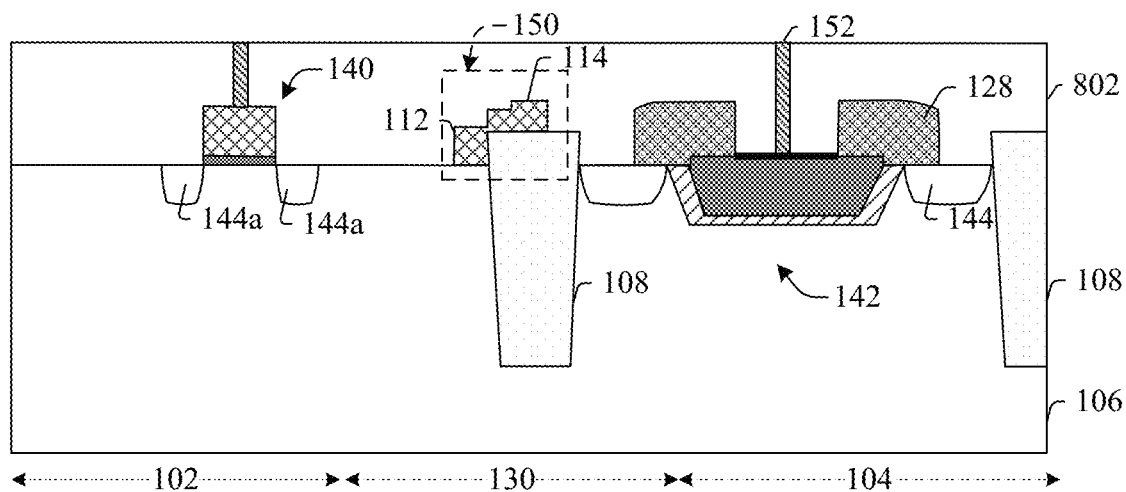

As shown in FIG. 8, in some embodiments, an ILD layer 802 is formed overlying the low voltage transistor device 140 in the low voltage region 102, the boundary structure 150 in the boundary region 130, and the gate masking structure layer 128 in the high voltage region 104. A contact structure 152 is formed through the ILD layer 802 reaching on the low voltage transistor device 140 and the high voltage transistor device 142.

By forming the boundary structure 150 within the boundary region 130 as introduced above, residue contaminations and isolation damages due to gate dielectrics' patterning and removal can be reduced or even eliminated since portions of precursor layers are formed on a tilted sidewall of the supporting layers and thus completely removed during a subsequent etching process. Also, the disclosed boundary structure 150 provides supports during fabrications, such that the dishing effect is reduced or eliminated. Thereby, device performance is improved and manufacturing process is simplified, such that further scaling becomes possible in emerging technology nodes.

FIG. 1 illustrates a cross-sectional view of an integrated circuit 100 comprising a boundary region 130 defined between a low voltage region 102 and a medium voltage region 103. In some embodiments, a low voltage transistor device 140 is disposed within the low voltage region 102. The low voltage transistor device 140 has a low voltage gate electrode 118 disposed over a low voltage gate dielectric layer 120 between a first pair of source/drain regions 144a. In some embodiments, the low voltage gate electrode 118 comprises polysilicon. In some other embodiments, the low voltage gate electrode 118 may be made of metal or metal alloy material. The low voltage gate dielectric layer 120 may comprise a high-k gate dielectric layer. The low voltage gate dielectric layer 120 may cover bottom and sidewall surfaces of the low voltage gate electrode 118 as an alternative to a planar structure shown in FIG. 1. By making use of HKMG structure in transistors of the low voltage region 102, transistor capacitance (and thereby drive current) is increased and gate leakage and threshold voltage are reduced. In some embodiments, the low voltage gate electrode 118 may comprise a core metal layer such as copper (Cu), tungsten (W) or aluminum (Al), or their alloys, for example and a barrier layer such as titanium (Ti), tantalum (Ta), zirconium (Zr), or their alloys, for example. In some embodiments, the low voltage gate dielectric layer 120 comprises a high-k dielectric material with a dielectric constant greater than 3.9. Examples of the low voltage gate dielectric layer 120 may be hafnium oxide (HfO), hafnium silicon oxide (HfSiO), hafnium aluminum oxide (HfAlO), or hafnium tantalum oxide (HMO).

A medium voltage transistor device 1206 is disposed in the medium voltage region 103. A high voltage transistor device 142 is disposed within the high voltage region 104. The high voltage transistor device 142 has a high voltage gate electrode 122 disposed over the high voltage gate dielectric layer 124 between a second pair of source/drain regions 144b. The high voltage transistor device 142 is configured to operate at an operation voltage greater than that of the low voltage transistor device 140. In some embodiments, the high voltage gate electrode 122 comprises polysilicon. In some other embodiments, the high voltage gate electrode 122 may be made of metal or metal alloy material. The high voltage gate electrode 122 may have a gate length and a gate width greater than that of the low voltage gate electrode 118. The high voltage gate electrode 122 may be recessed in the substrate 106. In some embodiments, the high voltage gate electrode 122 may comprise polysilicon material. The second transistor can be a driver transistor, a power transistor, among applications. The second transistor can be a LDMOS (laterally diffused metal oxide semiconductor) transistor designed for low on-resistance and high blocking voltage. Source/drain regions 144b are disposed alongside the high voltage gate electrode 122 and may be asymmetrical. The high voltage gate dielectric layer 124 can have a thickness greater than that of the low voltage gate dielectric layer 120. In some embodiments, the thickness of the high voltage gate dielectric layer 124 is about 2 to 5 times of a thickness of the low voltage gate dielectric layer 120, such that the high voltage gate dielectric layer 124 may support a greater break down voltage. For example, the low voltage gate dielectric layer 120 can have a thickness in a range of from about 30 angstroms (Å) to about 100 Å, while the high voltage gate dielectric layer 124 can have a thickness in a range of from about 150 Å to about 400 Å. As can be appreciated, theses dimensions, and other dimensions discussed herein can be scaled for different process nodes. In some embodiments, the medium voltage transistor device 1206 may have structures similar to the high voltage transistor device 142 but with smaller dimensions. The high voltage transistor device 142 may be used to drive memory cells, and may have a relatively high operating voltage level (e.g., greater than 10V). The medium voltage transistor device 1206 for example, may be an RF (radio frequency) device or a MIM (metal-insulator-metal) device, and may have an operating voltage level smaller than the high voltage device (e.g., around 6-10V). The low voltage transistor device 140 may have an operating voltage level smaller than the medium voltage transistor device 1206 and may be a core device with an operating voltage level smaller than 1.5V or around 0.9-1.1V, a word line device with an operating voltage level around 1V to 2V, or an I/O (input and output) device with an operating voltage level around 1.5V to 3V. In some embodiments, a gate masking structure layer 128 may be disposed over the substrate 106 at a peripheral region of the high voltage gate electrode 122. A sacrifice dielectric layer 126 may be disposed between the gate masking structure layer 128 and the substrate 106.

Within the boundary region 130, an isolation structure 108 (such as a shallow trench isolation (STI) structure or a deep trench isolation (DTI) structure) is disposed in an upper portion of the substrate 106. The isolation structure 108 may protrude from the substrate 106 having a top surface at a position higher than an upper surface of the substrate 106. A first polysilicon component 112 may be disposed on the upper surface of the substrate 106 adjacent to the isolation structure 108. A boundary dielectric layer 110 may be disposed directly on the top surface of the isolation structure 108. A second polysilicon component 114 may be disposed directly on the boundary dielectric layer 110. In some embodiments, the boundary dielectric layer 110 may be a continuous portion of the sacrifice dielectric layer 126, and thus the boundary dielectric layer 110 may be made of the same material and the same thickness of the sacrifice dielectric layer 126 in the high voltage region 104. In some embodiments, the first polysilicon component 112 and the second polysilicon component 114 may be made of the same material. The first polysilicon component 112 or the second polysilicon component 114 may comprise pure polysilicon or very lightly doped polysilicon. In some embodiments, the boundary dielectric layer 110 can comprise oxide material, such as silicon dioxide.

Still within the boundary region 130, the first polysilicon component 112 may have a continuous planar top surface. In some embodiments, the top surface of the second polysilicon component 114 may comprise a first planar portion 132 and a second planar portion 134. The first planar portion 132 is closer to the low voltage region 102, and the second planar portion 134 is closer to the high voltage region 104. In the illustrated embodiment, the first planar portion 132 is positioned lower than the second planar portion 134 relative to the substrate 106. In some embodiments, the first planar portion 132 and the second planar portion 134 may have the substantially same lateral length. The second polysilicon component 114 may have a maximum thickness equal to that of the first polysilicon component 112. The thickness of the second polysilicon component 114 may also be greater or smaller than that of the first polysilicon component 112. In some embodiments, the second polysilicon component 114 and the boundary dielectric layer 110 may be disposed on a portion of the top surface of the isolation structure 108 closer to the low voltage region 102 while leave a remaining portion of the top surface of the isolation structure 108 closer to the high voltage region 104 absent from the boundary dielectric layer 110. In some alternative embodiments, the second polysilicon component 114 and the boundary dielectric layer 110 may cover the whole top surface of the isolation structure 108 in the boundary region 130.

In some embodiments, a first inter-layer dielectric (ILD) layer 136 is disposed surrounding the low voltage transistor device 140, the high voltage transistor device 142, and the boundary structure 150. A second inter-layer dielectric (ILD) layer 138 may be disposed over the first inter-layer dielectric (ILD) layer 136. The first inter-layer dielectric (ILD) layer 136 and/or the second inter-layer dielectric (ILD) layer 138 may comprise same or different low-k dielectric layer, ultra-low-k dielectric layer, extreme low-k dielectric layer, and/or silicon dioxide layer. One or more of the plurality of contacting structures may extend through the first inter-layer dielectric (ILD) layer 136 and be coupled to the source/drain regions. In some embodiments, the plurality of contacting structures 152 may comprise a metal such as tungsten, copper, and/or aluminum.

In some embodiments, the low voltage gate electrode 118 and the second polysilicon component 114 may have aligned top surfaces. A top surface of the high voltage gate electrode 122 may be lower than the top surface of the low voltage gate electrode 118 or the second polysilicon component 114. In some embodiments, the gate masking structure layer 128 may have a top surface aligned with the low voltage gate electrode 118 or the second polysilicon component 114.

FIGS. 9-26 illustrate a series of cross-sectional views 900-2600 of some embodiments of a method for manufacturing an IC comprising a boundary structure disposed between a low voltage region and a medium region or a high voltage region.

Figure 9:
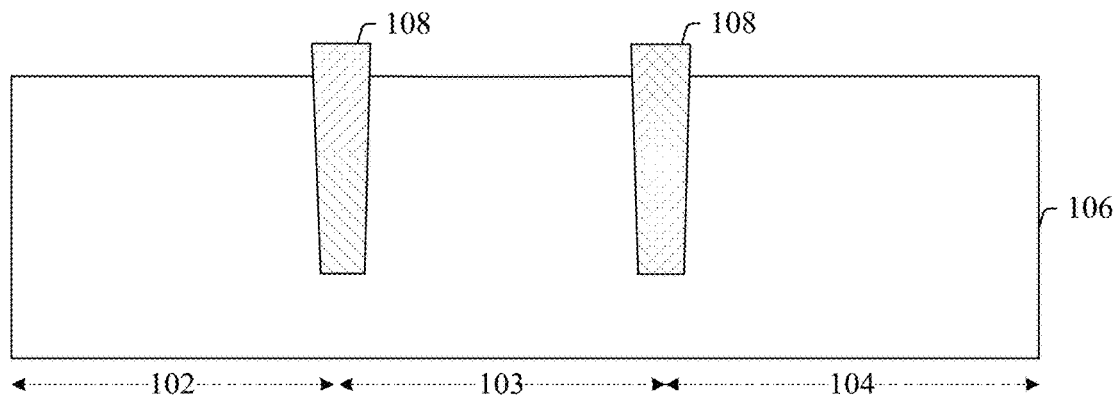
FIGS. 9-26 illustrate a series of cross-sectional views of some alternative embodiments of a method for manufacturing an IC comprising a boundary region defined between a low voltage region and a high voltage region.

As shown in cross-sectional view 900 of FIG. 9, in some embodiments, a substrate 106 is provided including a low voltage region 102, a medium voltage region 103, and a high voltage region 104. In various embodiments, the substrate 106 may comprise any type of semiconductor body (e.g., silicon/CMOS bulk, SiGe, SOI, etc.) such as a semiconductor wafer or one or more die on a wafer, as well as any other type of semiconductor material. In some embodiments, isolation structures 108 may be formed within the substrate 106. The isolation structures 108 may be formed by selectively etching the substrate 106 to form a trench defined by sidewalls of the substrate 106. The trench is subsequently filled with one or more dielectric materials, such as, for example, silicon-dioxide, forming the isolation structures 108.

Figure 10:
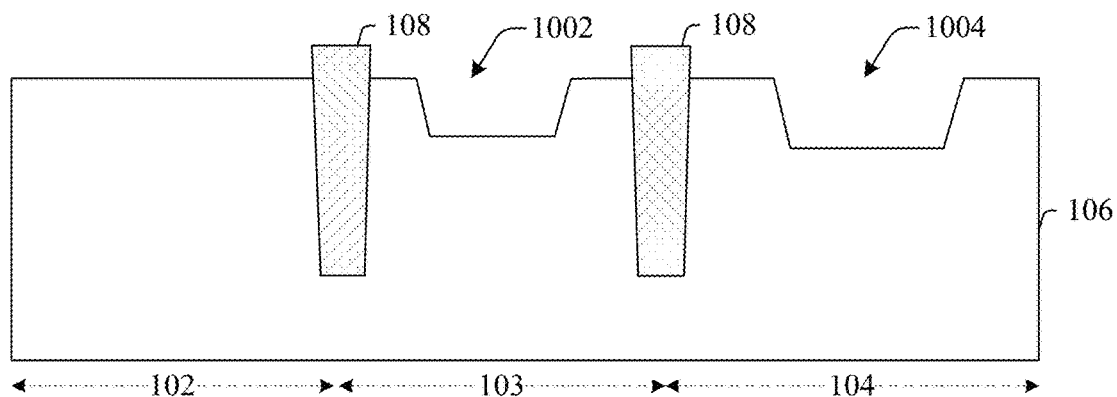

As shown in cross-sectional view 1000 of FIG. 10, in some embodiments, a plurality of trenches 1002, 1004 are formed in an upper region of the substrate 106 as gate trenches in the medium voltage region 103 and the high voltage region 104. The trenches 1002, 1004 may be formed by one or more photolithography processes followed by one or more etching processes of the substrate 106 between the isolation structures 108. The trenches 1002 in the medium voltage region 103 may have a depth smaller than that of the trenches 1004 in the high voltage region 104. The depths of the trenches 1002, 1104 may have a depth within a range, for example, of between approximately 70 nanometers and approximately 150 nanometers. Though not shown in the figure, the substrate 106 may then undergo ion implantation to form doped regions (e.g., n-type or p-type) between the isolation structures 108 as device wells, source/drain regions and other doped structure.

Figure 11:
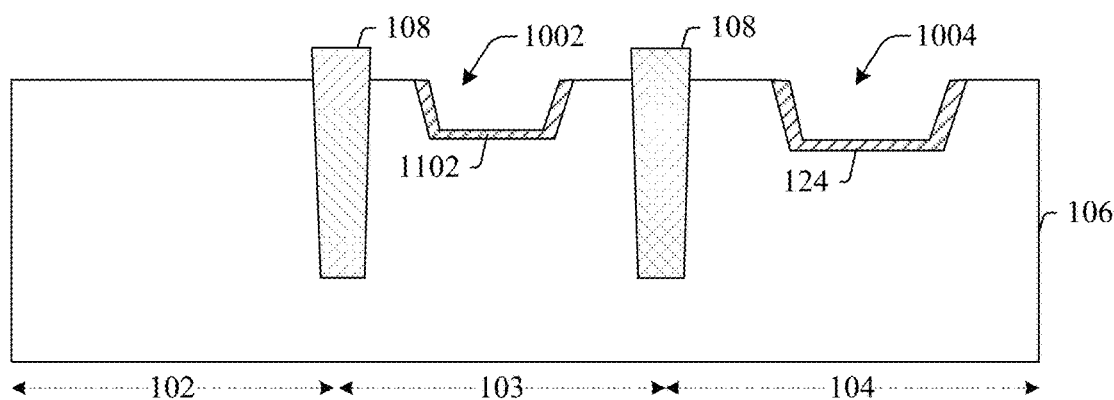

As shown in cross-sectional view 1100 of FIG. 11, in some embodiments, a medium voltage dielectric layer 1102 and a high voltage gate dielectric layer 124 are formed along the trenches 1002, 1004. The medium voltage dielectric layer 1102 and the high voltage gate dielectric layer 124 may be formed by different thermal process or deposition processes combined with patterning processes and may be formed with different thicknesses. The thickness of the high voltage gate dielectric layer 124 can be about 2 to 5 times of a thickness of the medium voltage dielectric layer 1102. The medium voltage dielectric layer 1102 and the high voltage gate dielectric layer 124 may be an oxide layer, such as a silicon dioxide layer, but other suitable gate dielectric material is also applicable. The thicknesses of the medium voltage dielectric layer 1102 and the high voltage gate dielectric layer 124 depend on applications, ranging from about several or tens of nanometers (nm) for current nodes to several angstroms (Å) for emerging nodes.

Figure 12:
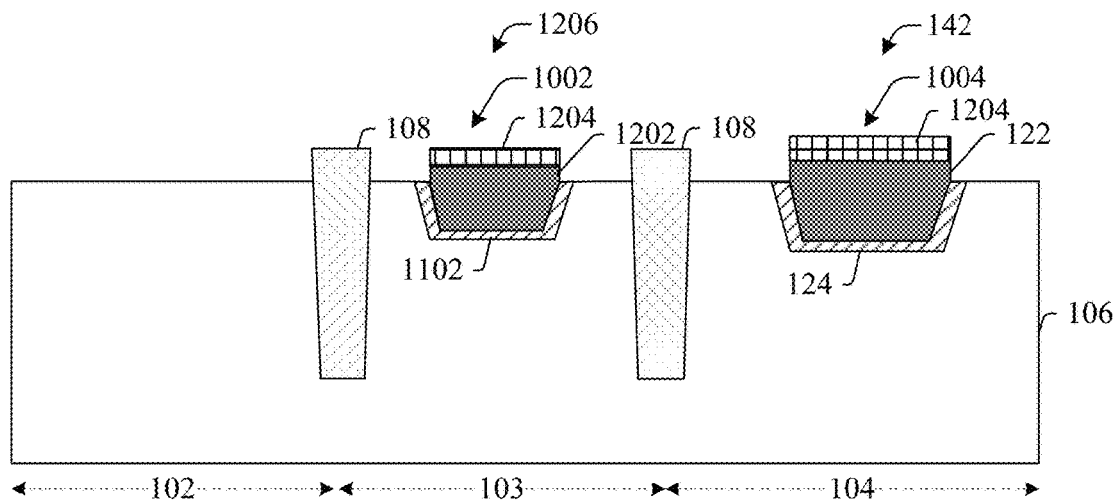

As shown in cross-sectional view 1200 of FIG. 12, in some embodiments, a medium voltage gate electrode 1202 and a high voltage gate electrode 122 are respectively formed on the medium voltage dielectric layer 1102 and the high voltage gate dielectric layer 124 using a masking layer 1204 and filling spaces of the trenches 1002, 1004, thus forming the medium voltage transistor device 1206 and the high voltage transistor device 142. The medium voltage gate electrode 1202 and the high voltage gate electrode 122 are formed through one or more deposition processes (e.g., chemical vapor deposition, physical vapor deposition, etc.). The medium voltage gate electrode 1202 and the high voltage gate electrode 122 may be made of doped polysilicon.

Figure 13:
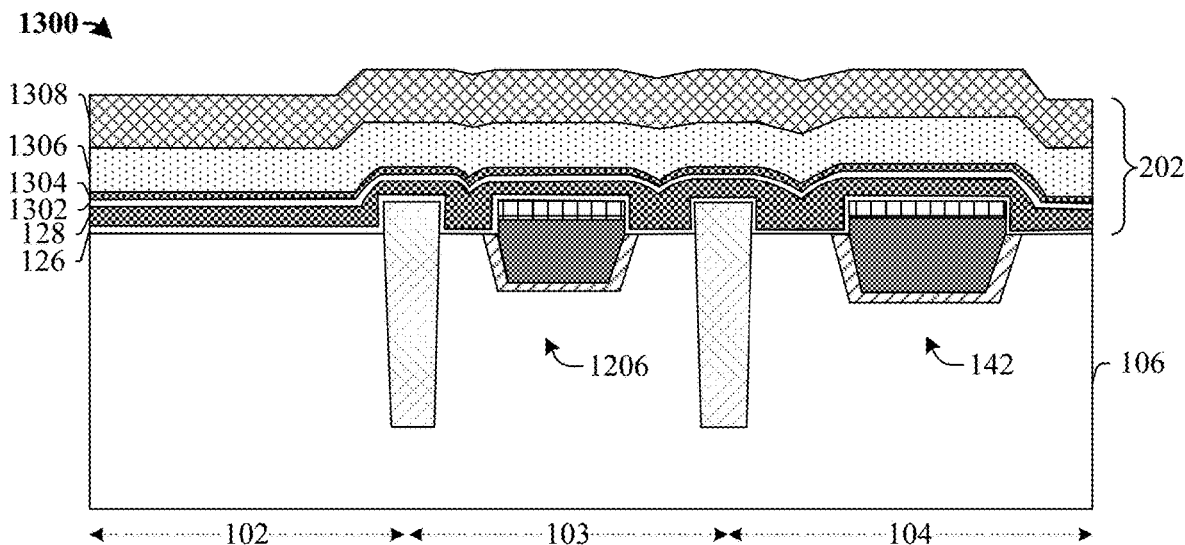

As shown in cross-sectional view 1300 of FIG. 13, in some embodiments, a first supporting layer 202 is formed over the medium voltage transistor device 1206 and the high voltage transistor device 142. In some embodiments, the first supporting layer 202 comprises a stack of different materials formed by deposition techniques. For example, the first supporting layer 202 may comprise a stack of CMP protection layers disposed over a sacrifice dielectric layer 126 (e.g. a sacrifice silicon dioxide layer). An example of such stack of CMP protection layers may include a gate masking structure layer 128 (e.g. a silicon nitride layer) and a thin poly silicon liner 1302. A stack of hard mask layers may be deposited over the stack of CMP protection layers. An example of such stack of hard mask layers may include a first thin dielectric liner 1304 (e.g. a silicon nitride liner) and a second dielectric layer 1306 (e.g. a silicon dioxide layer) disposed over the first thin dielectric liner 1304 (e.g. a silicon nitride liner). The first supporting layer 202 may further comprise a first polysilicon layer 1308 disposed over the stack of hard mask layer and configured to define a desired height of the first supporting layer 202.

Figure 14:
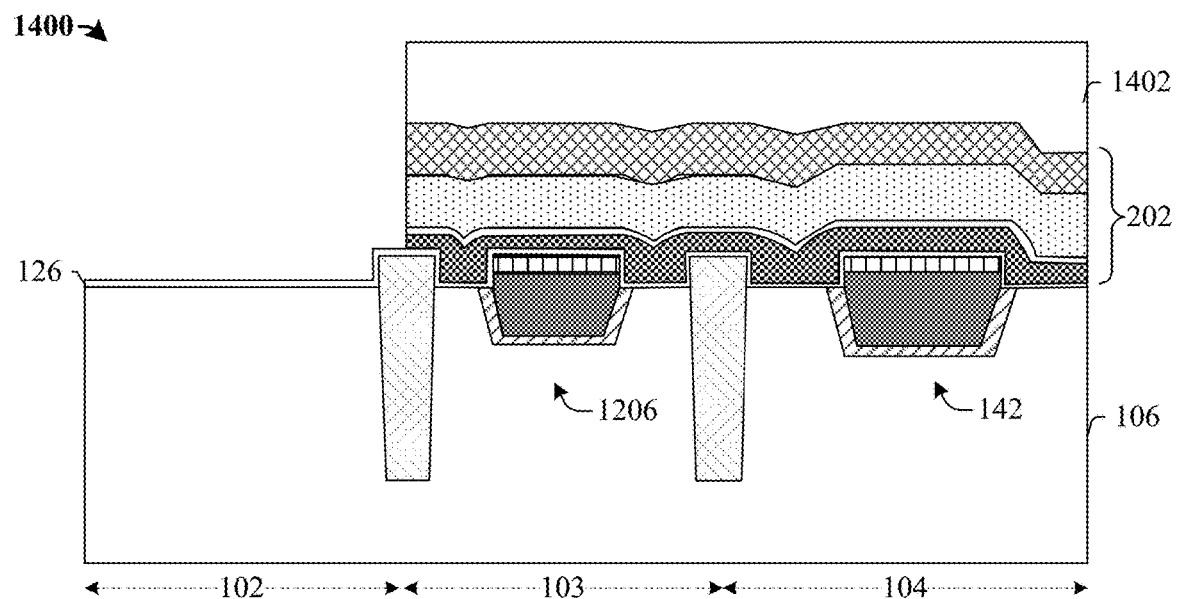

As shown in cross-sectional view 1400 of FIG. 14, in some embodiments, the first supporting layer 202 is patterned to be removed from the low voltage region 102 by a series of dry etching processes using a masking layer 1402. In some embodiments, the sacrifice dielectric layer 126 may be left in the low voltage region 102.

As shown in cross-sectional view 1500 of FIG. 15, in some embodiments, a second supporting layer 204 is formed over the substrate 106 in the low voltage region 102 and over the first supporting layer 202 over the medium voltage region 103 and the high voltage region 104. In some embodiments, the second supporting layer 204 may comprise a second polysilicon layer and is deposited to a designed thickness to define a tilt angle of a slanted sidewall after the etch back process discussed below.

As shown in cross-sectional view 1600 of FIG. 16, in some embodiments, the second supporting layer 204 is etched back to be removed from the low voltage region 102, and the first supporting layer 202 and the second supporting layer 204 collectively define a continuous and slanted sidewall 204s. In some embodiments, a series of blanket etching process is performed to the first supporting layer 202 and the second supporting layer 204. The etching processes may comprise a dry etch (e.g., a plasma etch with tetrafluoromethane (CF4), sulfur hexafluoride (SF6), nitrogen trifluoride (NF3), etc.). The slanted sidewall 204s is tilted to the high voltage region 104 from bottom to top and may have a tilted angle α substantially equal to 45 degrees or in a range of about 30 degrees to about 45 degrees. In some embodiments, the tilted angle α is in a range from 40 degrees to 50 degrees.

Figure 17:
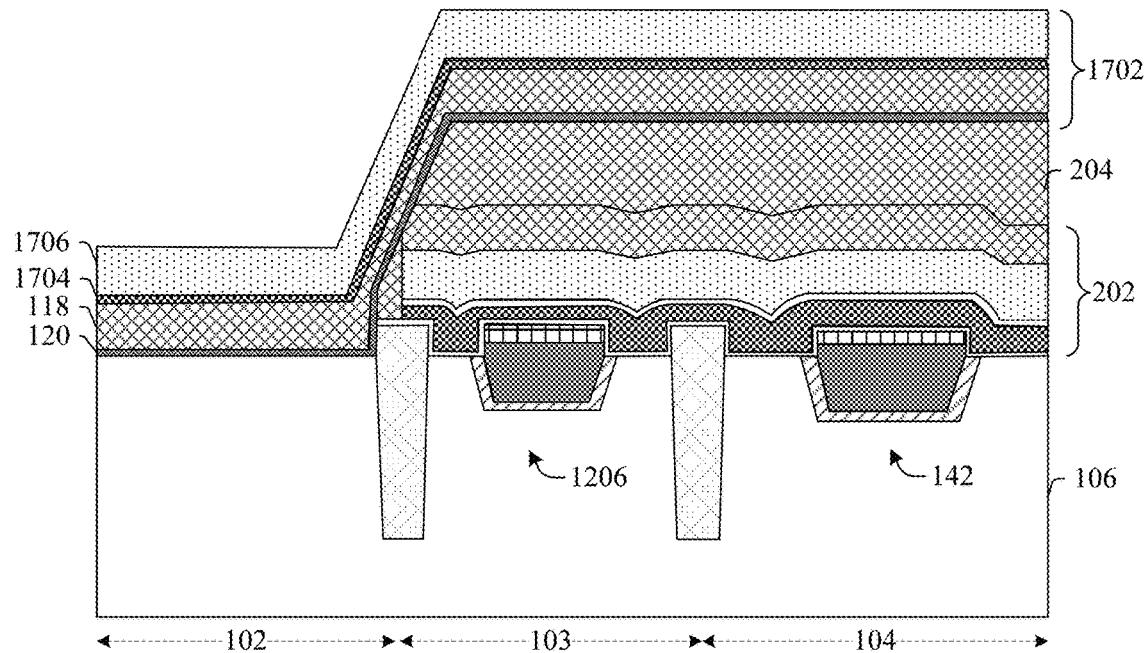

As shown in cross-sectional view 1700 of FIG. 17, in some embodiments, a low voltage gate precursor layer 1702 is formed over the substrate 106 in the low voltage region 102 and over the second supporting layer 204 over the medium voltage region 103 and the high voltage region 104. In some embodiments, the low voltage gate precursor layer 1702 may comprise a low voltage gate dielectric layer 120 (e.g. an interfacial layer (IL), a high-k dielectric layer, and a barrier layer (e.g. titanium nitride) stacked in that order), a low voltage gate electrode layer 118', and hard mask layers (e.g. a silicon dioxide layer 1706 stacked on a silicon nitride liner 1704, or one or more stacked silicon nitride and silicon dioxide layers).

Figure 18:
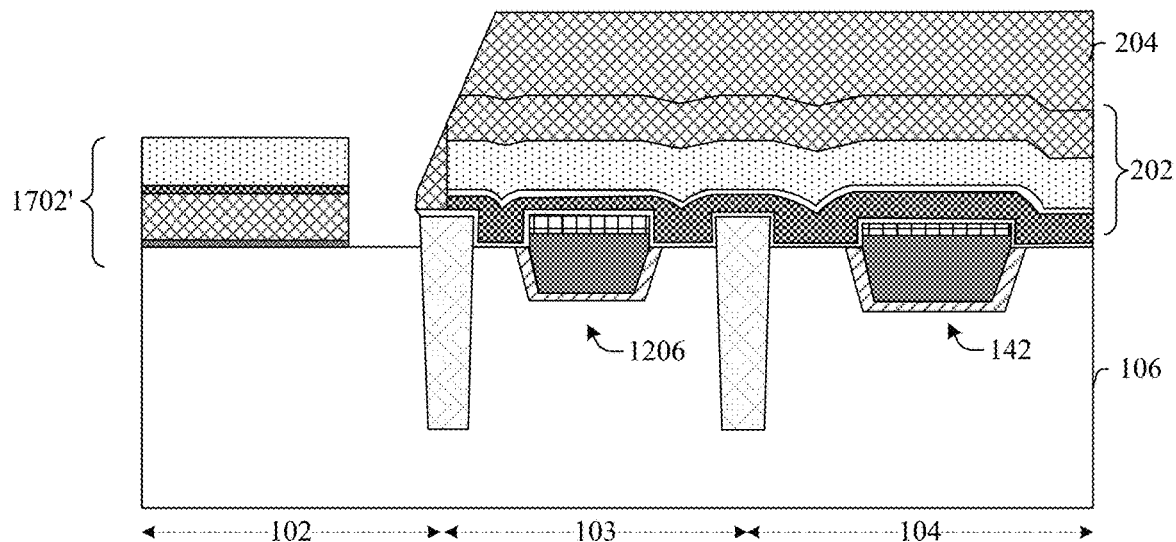

As shown in cross-sectional view 1800 of FIG. 18, in some embodiments, the low voltage gate precursor layer 1702 is patterned to be removed from the medium voltage region 103 and the high voltage region 104 and leave an altered low voltage gate precursor layer 1702' in the low voltage region 102. The low voltage gate precursor layer 1702 is removed from the boundary region completely due to the continuous and slanted sidewall. Thereby, contaminations of the residues from the low voltage gate precursor layer 1702 are minimized.

Figure 19:
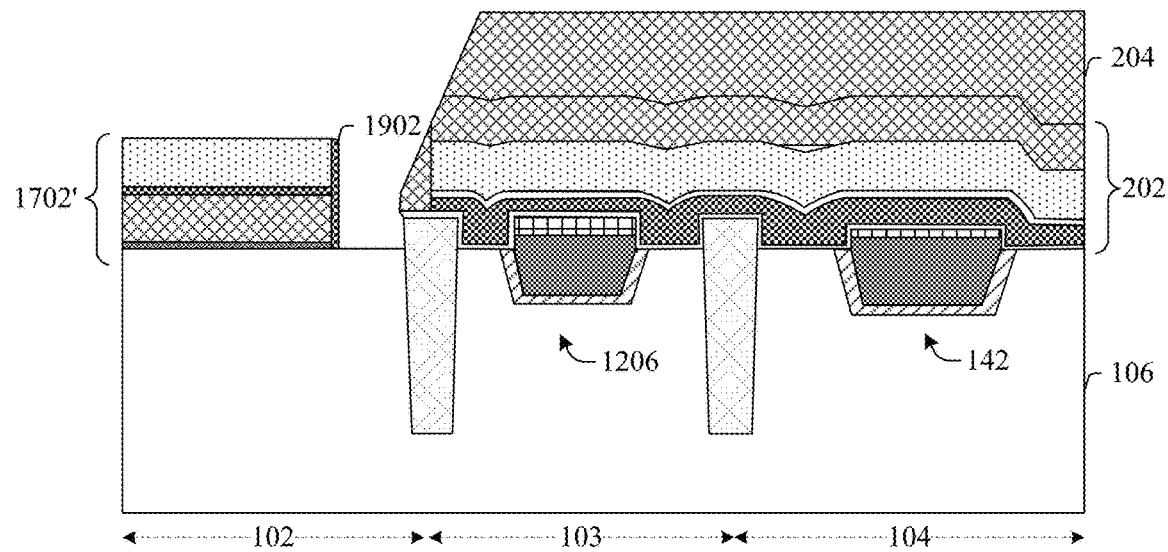

As shown in cross-sectional view 1900 of FIG. 19, in some embodiments, a sealing process is performed to protect sidewalls of the altered low voltage gate precursor layer 1702' in the low voltage region 102. A sealing layer 1902 may comprise a silicon nitride liner and may be deposited on sidewalls of the altered low voltage gate precursor layer 1702 by a conformal deposition technique (e.g. CVD) followed by a dry etching process to be removed from lateral and slanted surfaces.

Figure 20:
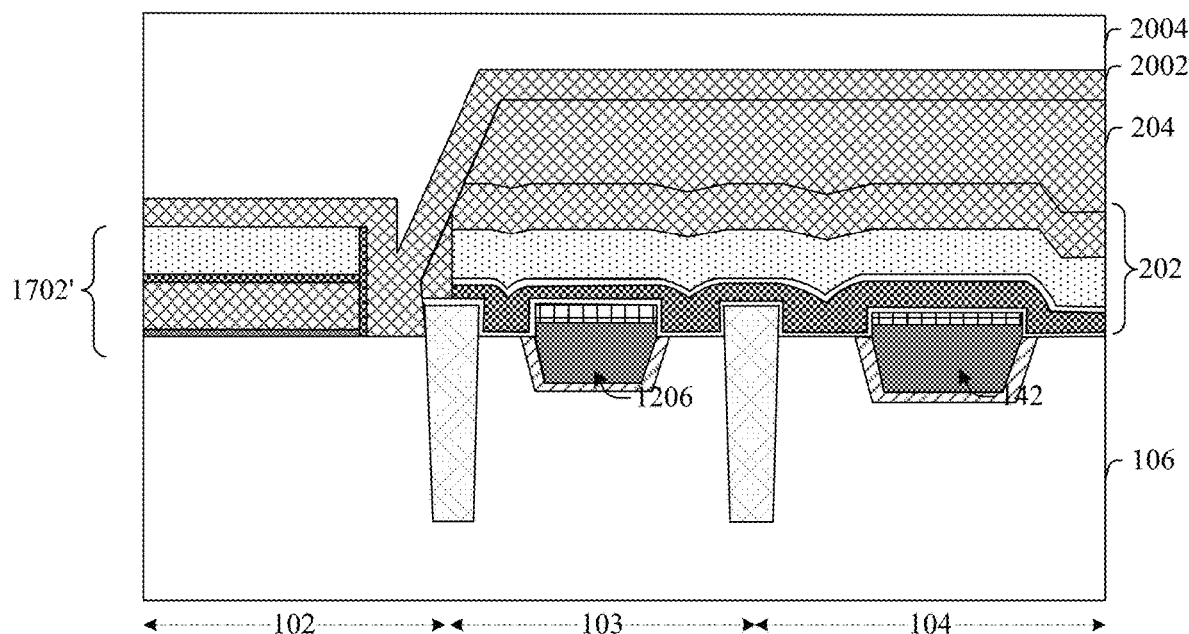

As shown in cross-sectional view 2000 of FIG. 20, in some embodiments, a boundary filling process is performed to fill a slit between the low voltage region 102 and the medium voltage region 103. In some embodiments, a polysilicon layer 2002 is deposited on the altered low voltage gate precursor layer 1702' and the second supporting layer 204. The polysilicon layer 2002 may be formed conformally and may be formed by a chemical vapor deposition (CVD) process such that the slit between the low voltage region 102 and the medium voltage region 103 can be well filled. A filling layer 2004 (e.g. made of photoresist material) may be subsequently coated or spin-on to form a planar top surface.

Figure 21:
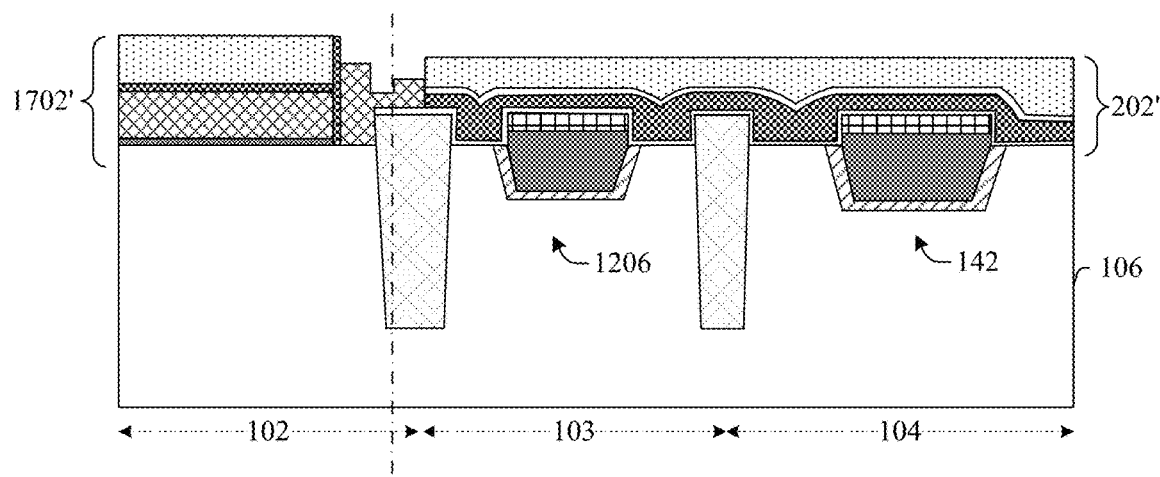

As shown in cross-sectional view 2100 of FIG. 21, in some embodiments, an etching back process is performed to remove the second supporting layer 204 and some upper layers of the first supporting layer 202. The polysilicon layer 2002 is concurrently etched back to a position laterally aligned to a remaining portion of the first supporting layer 202'.

Figure 22:
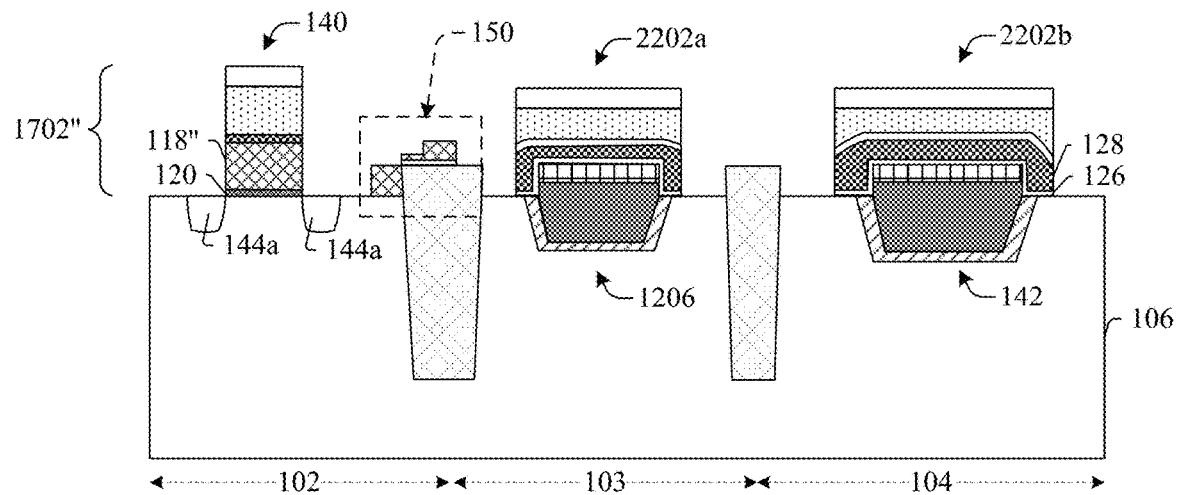

As shown in cross-sectional view 2200 of FIG. 22, in some embodiments, the altered low voltage gate precursor layer 1702' is patterned to form a low voltage gate stack 1702" comprising a low voltage gate dielectric layer 120 and a poly gate electrode 118". The remaining portion of the first supporting layer 202' is concurrently patterned to form discrete portions 2202a, 2202b respectively overlying the medium voltage transistor device 1206 and the high voltage transistor device 142. A pair of source/drain regions 144a may be formed in the substrate 106 on opposite sides of the low voltage gate stack 1702". A boundary structure 150 is formed between the low voltage region 102 and the medium voltage region 103.

Figure 23:
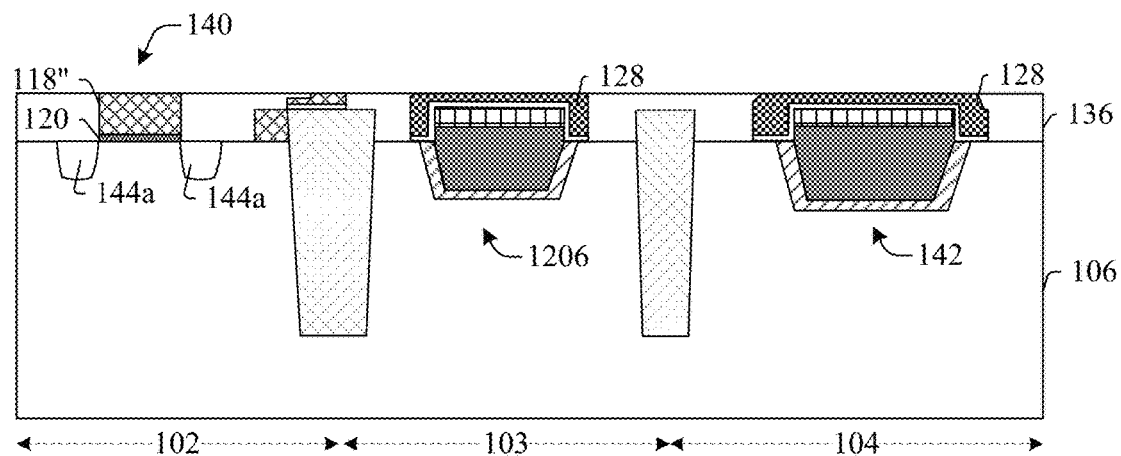

As shown in cross-sectional view 2300 of FIG. 23, in some embodiments, a first ILD layer 136 is formed surrounding the low voltage transistor device 140. The first ILD layer 136 may be formed over the low voltage transistor device 140, the medium voltage transistor device 1206, and the high voltage transistor device 142 followed by a planarization process. The planarization process may comprise a chemical mechanical polishing (CMP) process. The gate masking structure layer 128 may be exposed after the planarization process.

Figure 24:
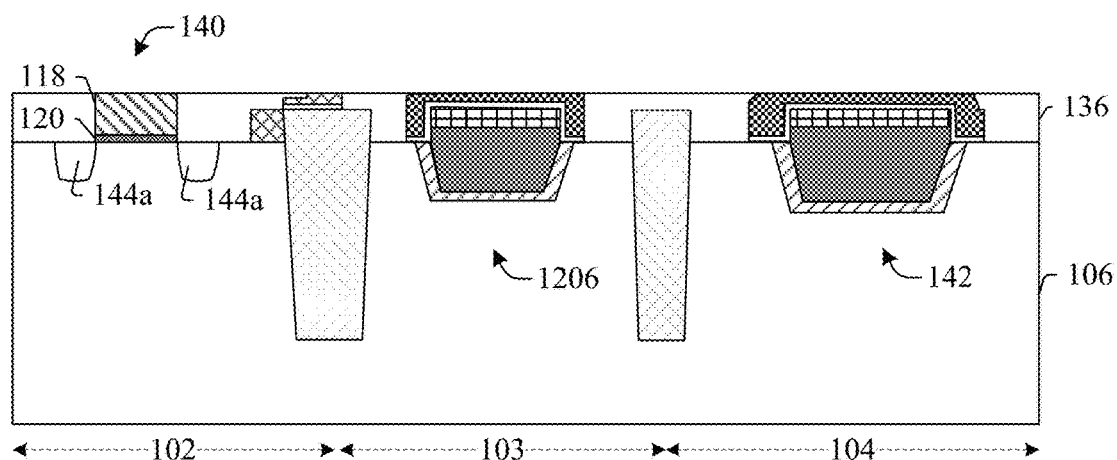

As shown in cross-sectional view 2400 of FIG. 24, in some embodiments, a replacement gate process may be subsequently performed by replacing the poly gate electrode 118" by metal materials to form a low voltage gate electrode 118. A series of deposition and etching processes can be performed that form different metal compositions for different devices or different components of the same devices, to achieve desired work functions.

Figure 25:
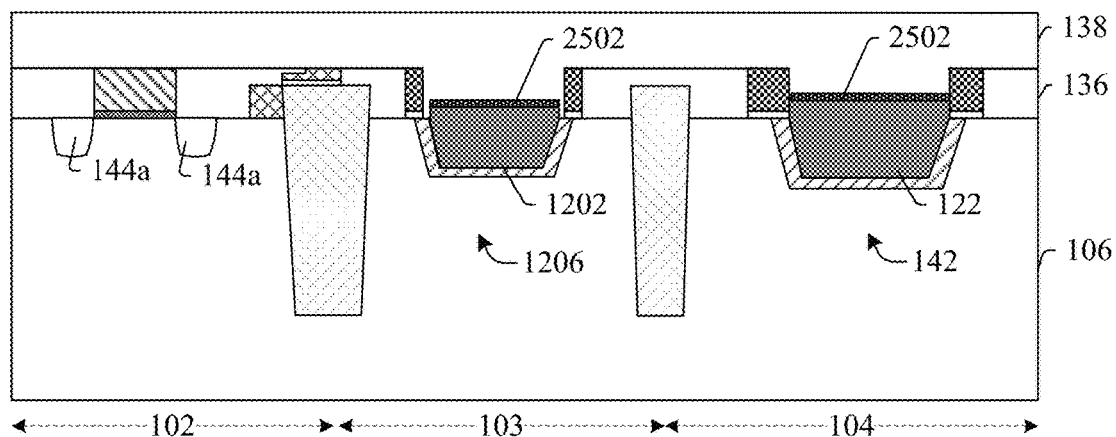

As shown in cross-sectional view 2500 of FIG. 25, in some embodiments, a second ILD layer 138 is formed over the first ILD layer 136. In some embodiments, the discrete portions 2202a, 2202b of the remaining portion of the first supporting layer 202' may be patterned prior to forming the second ILD layer 138 to form openings exposing the gate electrodes 1202, 122 (See FIGS. 21-22 for numerals 2202a, 2202b, and 202'). A silicide layer 2502 may be formed on an exposed surface of the gate electrodes 1202, 122. The second ILD layer 138 may also fill the openings formed before and cover the gate electrodes 1202, 122.

Figure 26:
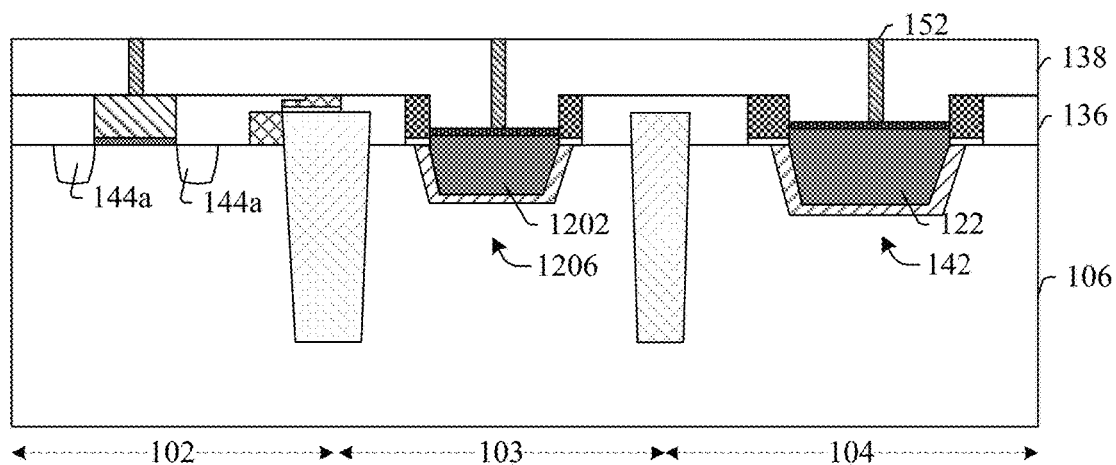

As shown in cross-sectional view 2600 of FIG. 26, in some embodiments, contacting structures 152 are formed through the second ILD layer 138 reaching on upper surfaces of the gate electrodes 1202, 122. The contacting structures 152 may be formed by selectively etching the second ILD layer 138 and/or the first ILD layer 136 to form openings (e.g. with a patterned photoresist mask in place), and by subsequently depositing a conductive material within the openings. In some embodiments, the conductive material may comprise tungsten (W) or titanium nitride (TiN), for example.

Figure 27:
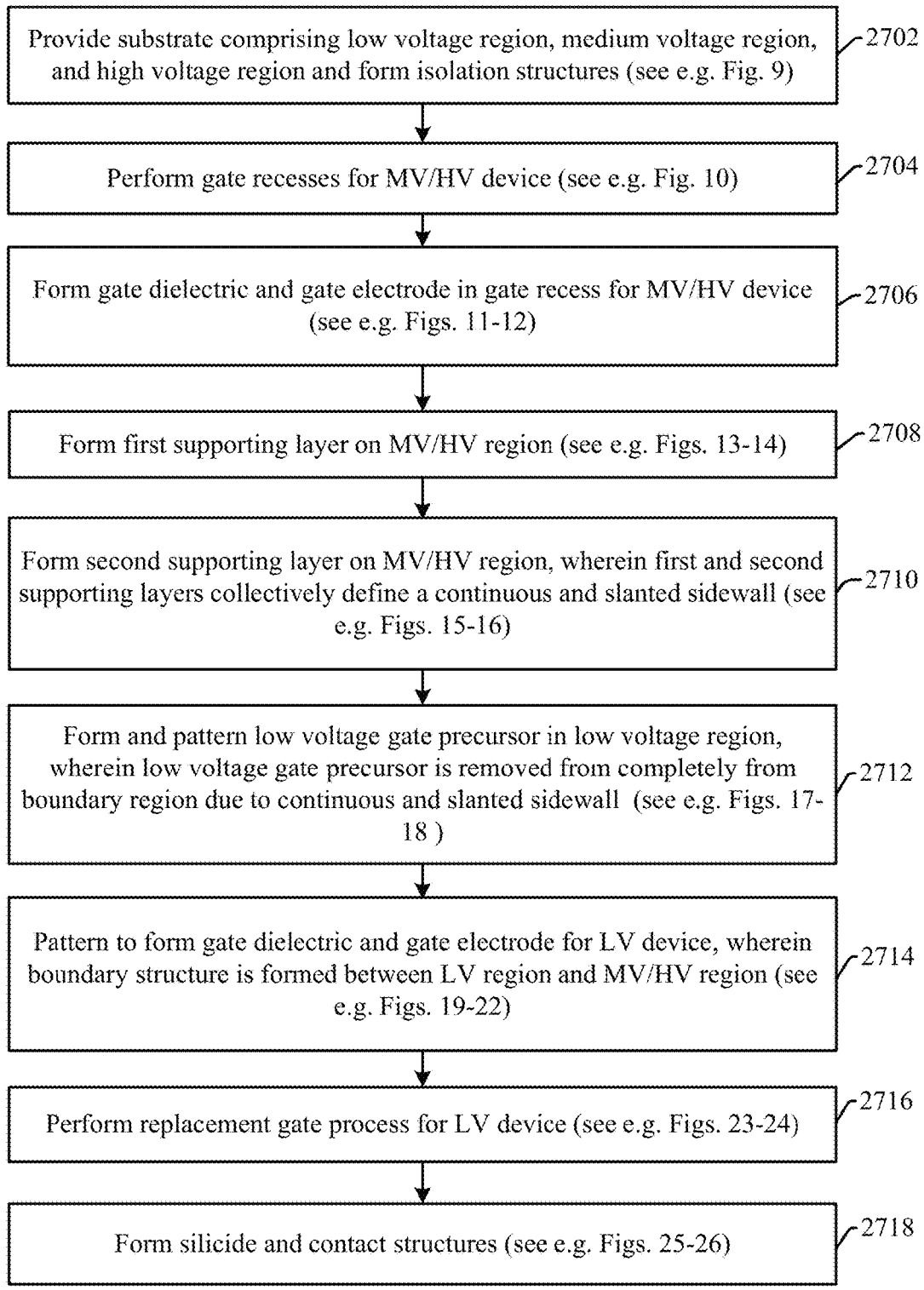
FIG. 27 illustrates a flow diagram of some embodiments of a method for manufacturing an IC comprising a boundary region defined between a low voltage region and a high voltage region.

FIG. 27 illustrates a flow diagram of some embodiments of a method 2700 for manufacturing an IC comprising a boundary structure between a low voltage region and a high voltage region.

Although method 2700 is described in relation to FIGS. 9-26, it will be appreciated that the method 2700 is not limited to such structures, but instead may stand alone as a method independent of the structures. Furthermore, while the disclosed methods (e.g., method 2700) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2702, a substrate is provided including a low voltage region and a high voltage region. In some embodiments, an isolation structure may be formed within the substrate between the low voltage region and the high voltage region. FIG. 9 illustrates some embodiments of a cross-sectional view 900 corresponding to act 2702.

At 2704, a trench is formed in an upper region of the substrate as a gate trench in the high voltage region. FIG. 10 illustrates some embodiments of a cross-sectional view 1000 corresponding to act 2704.

At 2706, a high voltage gate dielectric layer is formed along the trench. Then a high voltage gate electrode is formed on the high voltage gate dielectric layer filling the space of the gate trench. FIGS. 11-12 illustrate some embodiments of cross-sectional views 1100, 1200 corresponding to act 2706.

At 2708, a first supporting layer is formed and patterned to be removed from the low voltage region and left in the high voltage region. FIGS. 13-14 illustrate some embodiments of cross-sectional views 1300, 1400 corresponding to act 2708.

At 2710, a second supporting layer is formed and patterned to be removed from the low voltage region and left over the first supporting layer in the high voltage region. The first and second supporting layers collectively define a continuous and slanted sidewall. FIGS. 15-16 illustrate some embodiments of cross-sectional views 1500, 1600 corresponding to act 2710.

At 2712, a low voltage gate precursor layer is formed over the substrate in the low voltage region and over the second supporting layer over the high voltage region. The low voltage gate precursor layer is then patterned to be removed from the high voltage region and leave a patterned low voltage gate precursor layer in the low voltage region. The low voltage gate precursor layer 1702 is removed from the boundary region completely due to the continuous and slanted sidewall. FIGS. 17-18 illustrate some embodiments of cross-sectional views 1700, 1800 corresponding to act 2712.

At 2714, a gate dielectric and a gate electrode are patterned to form a low voltage device. A boundary structure is formed between the low voltage region and the high voltage region. FIGS. 19-22 illustrate some embodiments of cross-sectional views 1900-2200 corresponding to act 2714.

At 2716, in some embodiments, a replacement gate process may be subsequently performed by replacing the gate electrode by metal materials. FIGS. 23-24 illustrate some embodiments of cross-sectional views 2300, 2400 corresponding to act 2716.

At 2718, silicide layer and contacting structures are formed. FIGS. 25-26 illustrate some embodiments of cross-sectional views 2500, 2600 corresponding to act 2718.

Figure 28:
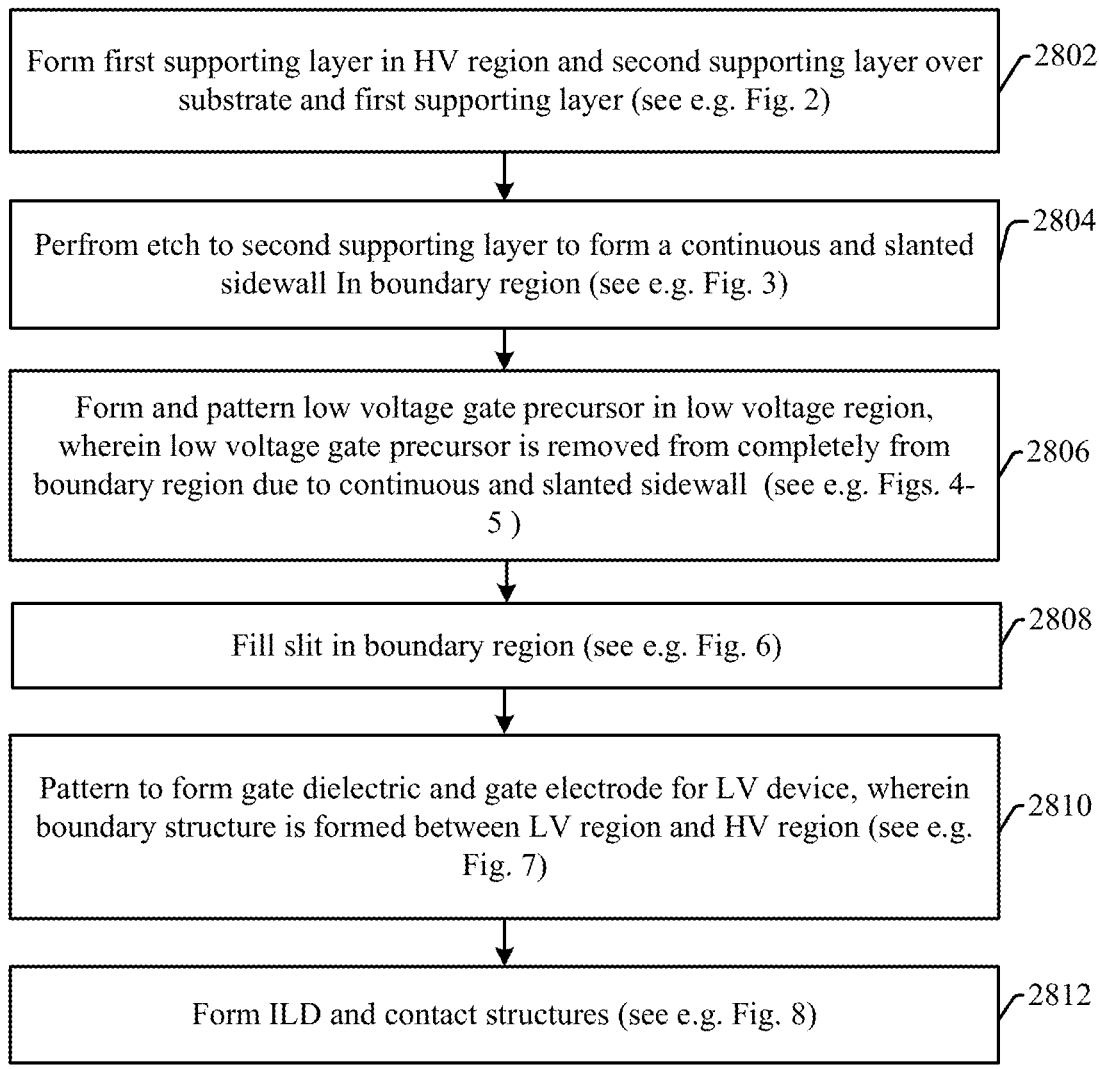
FIG. 28 illustrates a flow diagram of some alternative embodiments of a method for manufacturing an IC comprising a boundary region defined between a low voltage region and a high voltage region.

FIG. 28 illustrates a flow diagram of some alternative embodiments of a method 2800 for manufacturing an IC comprising a boundary structure between a low voltage region and a high voltage region.

Although method 2800 is described in relation to FIGS. 2-8, it will be appreciated that the method 2800 is not limited to such structures, but instead may stand alone as a method independent of the structures. Furthermore, while the disclosed methods (e.g., method 2800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2802, a substrate is provided including a low voltage region and a high voltage region. In some embodiments, an isolation structure may be formed within the substrate between the low voltage region and the high voltage region. A first supporting layer is formed over a high voltage transistor device in the high voltage region followed. A second supporting layer is formed over the first supporting layer in the high voltage region such that there is a height different from a lower portion in the low voltage region. FIG. 2 illustrates some embodiments of a cross-sectional view 200 corresponding to act 2802.

At 2804, an etching process is performed to form a slanted sidewall. The slanted sidewall is tilted to the high voltage region from bottom to top and may have a tilted angle $\alpha$ substantially equal to 45 degrees or in a range of about 30 degrees to about 45 degrees. FIG. 3 illustrates some embodiments of a cross-sectional view 300 corresponding to act 2804.

At 2806, a stack of low voltage gate precursor layers is formed over the substrate in the low voltage region and on the second supporting layer in the high voltage region. The low voltage gate precursor layers may comprise a low voltage gate electrode layer, a low voltage gate dielectric layer, and a masking layer. Then, the low voltage gate precursor layer is patterned to be removed from the high voltage region and leave an altered low voltage gate precursor layer in the low voltage region. The low voltage gate precursor layer is removed from the boundary region completely due to the continuous and slanted sidewall. FIGS. 4-5 illustrate some embodiments of cross-sectional views 400, 500 corresponding to act 2806.

At 2808, a boundary filling process is performed to fill a slit between the low voltage region and the high voltage region. In some embodiments, a conformal layer and a filling layer are formed to fill the slit. FIG. 6 illustrates some embodiments of a cross-sectional view 600 corresponding to act 2808.

At 2810, a patterning process is performed to form a low voltage transistor device in the low voltage region, a boundary structure in the boundary region, and a gate masking structure layer in the high voltage region. A pair of source/drain regions may be formed in the substrate on opposite sides of the low voltage gate stack. FIG. 7 illustrates some embodiments of a cross-sectional view 700 corresponding to act 2810.

At 2812, an ILD layer is formed overlying the low voltage transistor device in the low voltage region, the boundary structure in the boundary region, and the gate masking structure layer in the high voltage region. A contact structure is formed through the ILD layer reaching on the low voltage transistor device and the high voltage transistor device. FIG. 8 illustrates some embodiments of a cross-sectional view 800 corresponding to act 2812.

Therefore, the present disclosure relates to an integrated circuit (IC) that a boundary structure of a boundary region defined between a low voltage region and a high voltage region, and a method of formation and that provides small scale and high performance, and a method of formation.

In some embodiments, the present disclosure relates to an integrated circuit. The integrated circuit comprises a substrate comprising a low voltage region, a high voltage region, and a boundary region defined between the low voltage region and the high voltage region. An isolation structure is disposed in the boundary region of the substrate. A first polysilicon component is disposed over the substrate alongside the isolation structure. A boundary dielectric layer is disposed on the isolation structure. A second polysilicon component is disposed on the sacrifice dielectric layer.

In other embodiments, the present disclosure relates to a method of forming an integrated circuit. The method comprises providing a substrate comprising a low voltage region, a high voltage region, and a boundary region defined between the low voltage region and the high voltage region. A supporting layer is formed over the substrate in the high voltage region. The supporting layer has a slanted sidewall in the boundary region that is tilted to the high voltage region from bottom to top. A stack of low voltage gate precursor layers is formed over the substrate in the low voltage region and on the supporting layer in the high voltage region. The stack of low voltage gate precursor layers is patterned to form an altered low voltage gate precursor layer in the low voltage region. The stack of low voltage gate precursor layers is removed from the boundary region and the high voltage region when forming the altered low voltage gate precursor layer.

In yet other embodiments, the present disclosure relates to a method of forming an integrated circuit. The method comprises providing a substrate comprising a low voltage region, a high voltage region, and a boundary region defined between the low voltage region and the high voltage region. A first supporting layer is formed and patterned over the substrate in the high voltage region. A second supporting layer is formed over the substrate in the low voltage region and on the first supporting layer in the high voltage region. An etching process is performed to the second supporting layer and the first supporting layer to remove the second supporting layer from the low voltage region and to form a slanted sidewall in the boundary region. A stack of low voltage gate precursor layers is formed over the substrate in the low voltage region and over the first supporting layer in the high voltage region. The stack of low voltage gate precursor layers is patterned to form a low voltage transistor device in the low voltage region. The foregoing outlines features of several embodiments so that those skilled in the art may better understand the aspects of the present disclosure.

Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC), comprising:
   providing a substrate comprising a low voltage region, a high voltage region, and a boundary region defined between the low voltage region and the high voltage region;
   forming a supporting layer over the substrate in the high voltage region, wherein the supporting layer has a slanted sidewall in the boundary region that is tilted to the high voltage region from bottom to top;
   forming a stack of low voltage gate precursor layers over the substrate in the low voltage region;
   forming a conformal layer and a filling layer comprising a low voltage region portion overlying the stack of low voltage gate precursor layers, a high voltage region portion overlying the supporting layer, and a boundary region portion filled in a slit of the boundary region between the stack of low voltage gate precursor layers and the slanted sidewall of the supporting layer; and
   performing an etching back process to the filling layer and the conformal layer to expose an upper surface of the stack of low voltage gate precursor layers and leaving the boundary region portion with a reduced height.

2. The method of claim 1, wherein the stack of low voltage gate precursor layers is formed by depositing at least a low voltage gate dielectric layer, a low voltage gate electrode layer over the low voltage gate dielectric layer, and a masking layer over the low voltage gate electrode layer.

3. The method of claim 1, wherein the slanted sidewall has a tilted angle in a range from 40 degrees to 50 degrees.

4. The method of claim 1, wherein forming the supporting layer comprises:
   forming and patterning a first supporting layer in the high voltage region;
   forming a second supporting layer over the substrate in the low voltage region and over the first supporting layer in the high voltage region; and
   performing an etching back process to remove an upper portion of the second supporting layer and to form the slanted sidewall collectively from a lower portion of the second supporting layer and the first supporting layer.

5. The method of claim 1,
   wherein a high voltage device is formed in the high voltage region prior to forming the supporting layer; and
   wherein the supporting layer is etched and patterned leaving a lower portion overlying and protecting the high voltage device.

6. The method of claim 1, further comprising:
   performing a patterning process to the stack of low voltage gate precursor layers and the reduced height boundary region portion forming a low voltage transistor device in the low voltage region and a boundary structure in the boundary region.

7. A method of forming an integrated circuit (IC), comprising:
   providing a substrate comprising a low voltage region, a high voltage region, and a boundary region defined between the low voltage region and the high voltage region;
   forming and patterning a first supporting layer over the substrate in the high voltage region;
   forming a second supporting layer over the substrate in the low voltage region and on the first supporting layer in the high voltage region;
   performing an etching process to the second supporting layer and the first supporting layer to remove the second supporting layer from the low voltage region and to form a slanted sidewall in the boundary region; and
   forming a stack of low voltage gate precursor layers over the substrate in the low voltage region and over the first supporting layer in the high voltage region; and
   patterning the stack of low voltage gate precursor layers to form a low voltage transistor device in the low voltage region.

8. The method of claim 7, wherein the stack of low voltage gate precursor layers comprises a high-k dielectric layer disposed over the substrate and a poly gate electrode layer disposed over the high-k dielectric layer.

9. The method of claim 8, further comprising:
   removing and replacing the poly gate electrode layer with a metal gate electrode.

10. The method of claim 7, wherein the first supporting layer is formed by depositing a gate masking structure layer over the substrate, a hard mask layer over the gate masking structure layer, and a first polysilicon layer over the hard mask layer.

11. A method of forming an integrated circuit (IC), comprising:
    forming a high voltage transistor device within a substrate;
    forming an isolation structure within the substrate adjacent to the high voltage transistor device;
    forming a supporting layer over the high voltage transistor device and extending laterally and vertically beyond an uppermost surface of the isolation structure;
    performing an etching process to the supporting layer to form a slanting sidewall extending from the substrate to over the isolation structure;
    depositing a conformal polysilicon layer over the supporting layer wherein a bottommost surface of the conformal polysilicon layer extends beneath an uppermost surface of the isolation structure; and
    performing an etching process wherein the conformal polysilicon layer and supporting layer form a first polysilicon component disposed over and contacting the substrate alongside the isolation structure, and wherein the supporting layer forms a second polysilicon component disposed directly over the isolation structure.

12. The method of claim 11, further comprising:
forming a boundary dielectric layer over the isolation structure, such that the second polysilicon component is separated from the isolation structure by the boundary dielectric layer.

13. The method of claim 12, wherein the second polysilicon component comprises a first upper surface closer to the first polysilicon component and a second upper surface closer to the high voltage transistor device, wherein the first upper surface and the second upper surface are substantially flat and the first upper surface locates at a position lower than the second upper surface relative to the substrate.

14. The method of claim 12, wherein the second polysilicon component and the boundary dielectric layer is disposed on a portion of a top surface of the isolation structure closer to the first polysilicon component while leaving a remaining portion of the top surface of the isolation structure closer to the high voltage transistor device absent from the boundary dielectric layer.

15. The method of claim 11, further comprising:
forming a low voltage transistor device within the substrate on an opposite side of the isolation structure from the high voltage transistor device, wherein the low voltage transistor device is configured to operate at an operation voltage lower than that of the high voltage transistor device.

16. The method of claim 15, wherein the low voltage transistor device is separated from the first polysilicon component by a first distance, and the high voltage transistor device is separated from the first polysilicon component by a second distance, and the first distance is greater than the second distance.

17. The method of claim 15, wherein the low voltage transistor device has a top surface that is aligned with a top surface of the second polysilicon component.

18. The method of claim 11, further comprising:
forming gate masking structures in contact with the high voltage transistor device, wherein the gate masking structures have a top surface that is aligned with a top surface of the second polysilicon component.

19. The method of claim 11, wherein the high voltage transistor device comprises a pair of source/drain regions that are asymmetrical.

20. The method of claim 11, wherein the first polysilicon component and the second polysilicon component are contacting and made of the same material.

* * * * *